US009863978B2

(12) United States Patent
Böhm et al.

(10) Patent No.: US 9,863,978 B2
(45) Date of Patent: Jan. 9, 2018

(54) ELECTRICAL CONTACTING DEVICE

(71) Applicant: FEINMETALL GMBH, Herrenberg (DE)

(72) Inventors: Gunther Böhm, Nufringen (DE); Georg Steidle, Waldenbuch (DE); Wolfgang Schäfer, Grafenberg (DE); Achim Weiland, Mannheim (DE)

(73) Assignee: FEINMETALL GMBH, Herrenberg (DE)

( * ) Notice: Subject to any disclaimer, the term of this patent is extended or adjusted under 35 U.S.C. 154(b) by 122 days.

(21) Appl. No.: 14/786,770

(22) PCT Filed: Mar. 25, 2014

(86) PCT No.: PCT/EP2014/055890
§ 371 (c)(1),
(2) Date: Oct. 23, 2015

(87) PCT Pub. No.: WO2014/180596
PCT Pub. Date: Nov. 13, 2014

(65) Prior Publication Data
US 2016/0109483 A1    Apr. 21, 2016

(30) Foreign Application Priority Data
May 8, 2013    (DE) .......................... 10 2013 008 324

(51) Int. Cl.
*G01R 1/073*    (2006.01)
*G01R 31/28*    (2006.01)
(Continued)

(52) U.S. Cl.
CPC ..... *G01R 1/07357* (2013.01); *G01R 31/2889* (2013.01); *H01R 12/714* (2013.01); *H01R 12/91* (2013.01)

(58) Field of Classification Search
None
See application file for complete search history.

(56) References Cited

U.S. PATENT DOCUMENTS 5,952,843 A    9/1999 Vinh
6,232,669 B1    5/2001 Khoury et al.
(Continued)

FOREIGN PATENT DOCUMENTS

DE    19811795 C1    9/1999
DE    10050077 A1    5/2001
(Continued)

OTHER PUBLICATIONS

Japanese Office Action/Notice of Reasons for Rejection, corresponding to JP2016-512255, dated Dec. 6, 2016, with English Translation.
(Continued)

*Primary Examiner* — Paresh Patel
(74) *Attorney, Agent, or Firm* — Stephen T. Olson; Harness, Dickey & Pierce, P.L.C.

(57) ABSTRACT

An electrical contacting device for electrical physical contact with a specimen, particularly wafers, taking place in a contacting direction, with at least one conductor substrate which can be electrically connected to a testing device, at least one contact distance transformer and at least one contact head having electrical contact elements, particularly resilient contact elements, preferably serving to compensate different physical contact distances existing in the contacting direction particularly at the contact elements.

21 Claims, 11 Drawing Sheets

(51) Int. Cl.
*H01R 12/71* (2011.01)
*H01R 12/91* (2011.01)

(56) References Cited

U.S. PATENT DOCUMENTS

| | | | |
|---|---|---|---|
| 6,411,112 B1 | 6/2002 | Das et al. | |
| 6,509,751 B1* | 1/2003 | Mathieu | G01R 1/07307 |
| | | | 324/750.25 |
| 7,795,892 B2* | 9/2010 | Yamada | G01R 1/07378 |
| | | | 324/756.03 |
| 7,898,272 B2* | 3/2011 | Sasaki | G01R 31/2889 |
| | | | 324/754.07 |
| 8,456,184 B2* | 6/2013 | Yamada | G01R 1/07314 |
| | | | 324/754.11 |
| 2001/0050571 A1 | 12/2001 | Johnston | |
| 2005/0156611 A1 | 7/2005 | Shinde et al. | |
| 2008/0061808 A1 | 3/2008 | Mok et al. | |
| 2010/0327897 A1* | 12/2010 | Kazama | G01R 1/07378 |
| | | | 324/756.03 |

FOREIGN PATENT DOCUMENTS

| | | |
|---|---|---|
| EP | 0790502 A2 | 8/1997 |
| JP | 2005-534013 A | 11/2005 |
| JP | 2006-349692 A | 12/2006 |
| JP | 2007-155507 A | 6/2007 |
| JP | 2008-542745 A | 11/2008 |
| WO | 2011-030379 A1 | 3/2011 |

OTHER PUBLICATIONS

English Translation of International Preliminary Report on Patentability for PCT/EP2014/055890 dated Jul. 24, 2015, 8 pages.
International Search Report (English and German) for PCT/EP2014055890, ISA/EP, Rijswijk, NL, dated Jul. 16, 2014.
International Preliminary Report on Patentability for PCT/EP2014/055890 with annexes and their translation, IB/EP, Munich, dated Jul. 24, 2015.

* cited by examiner

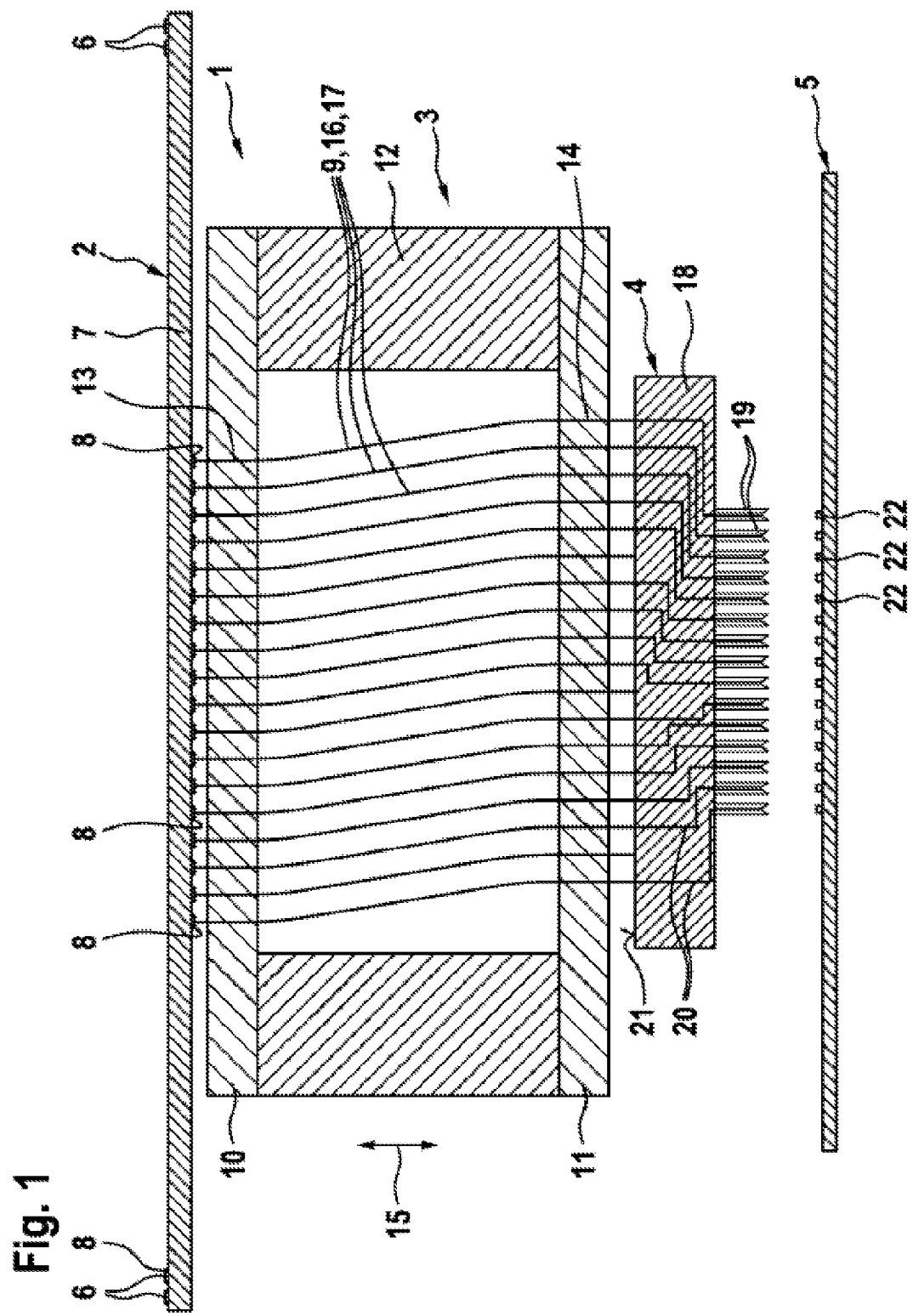

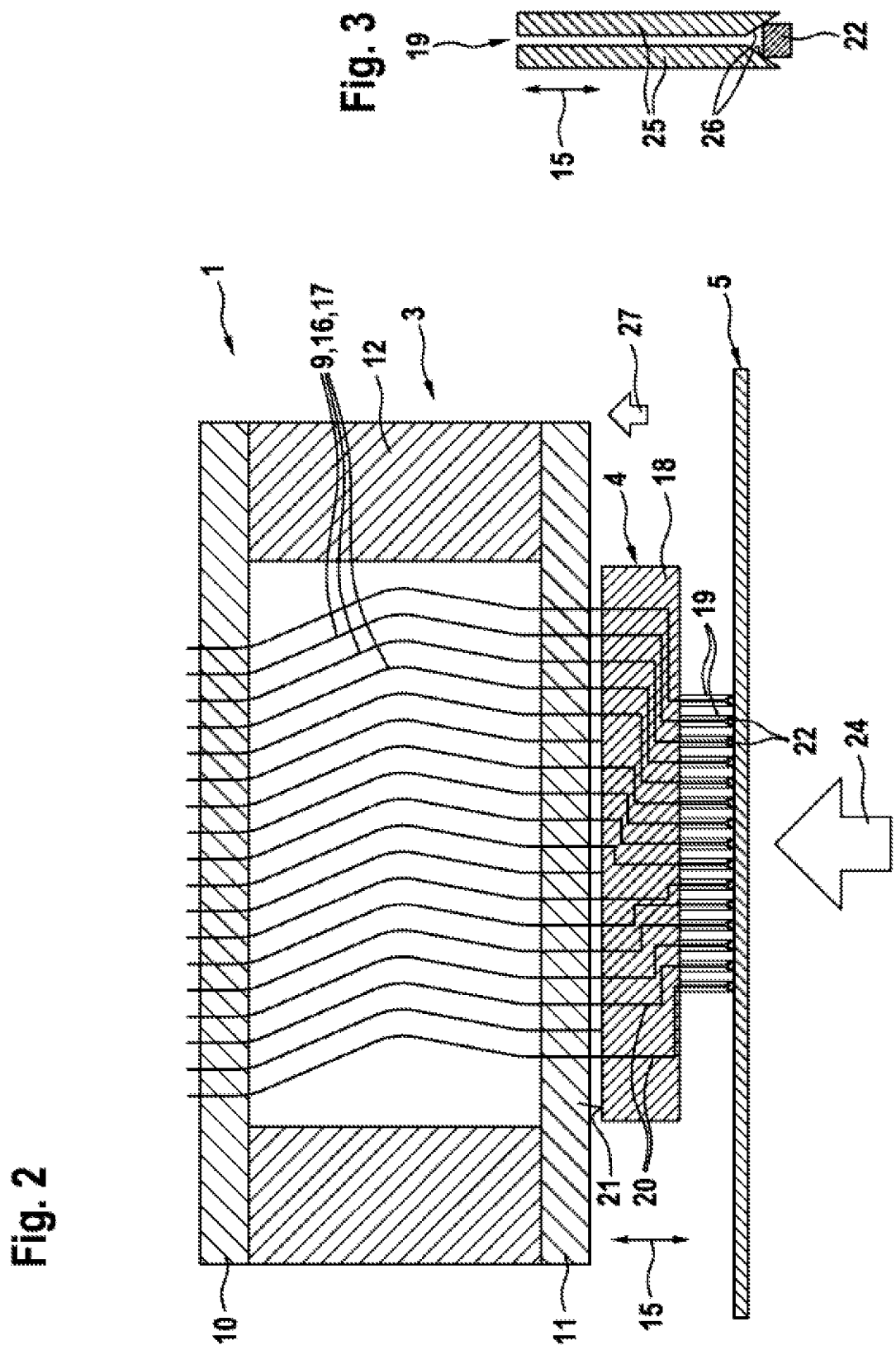

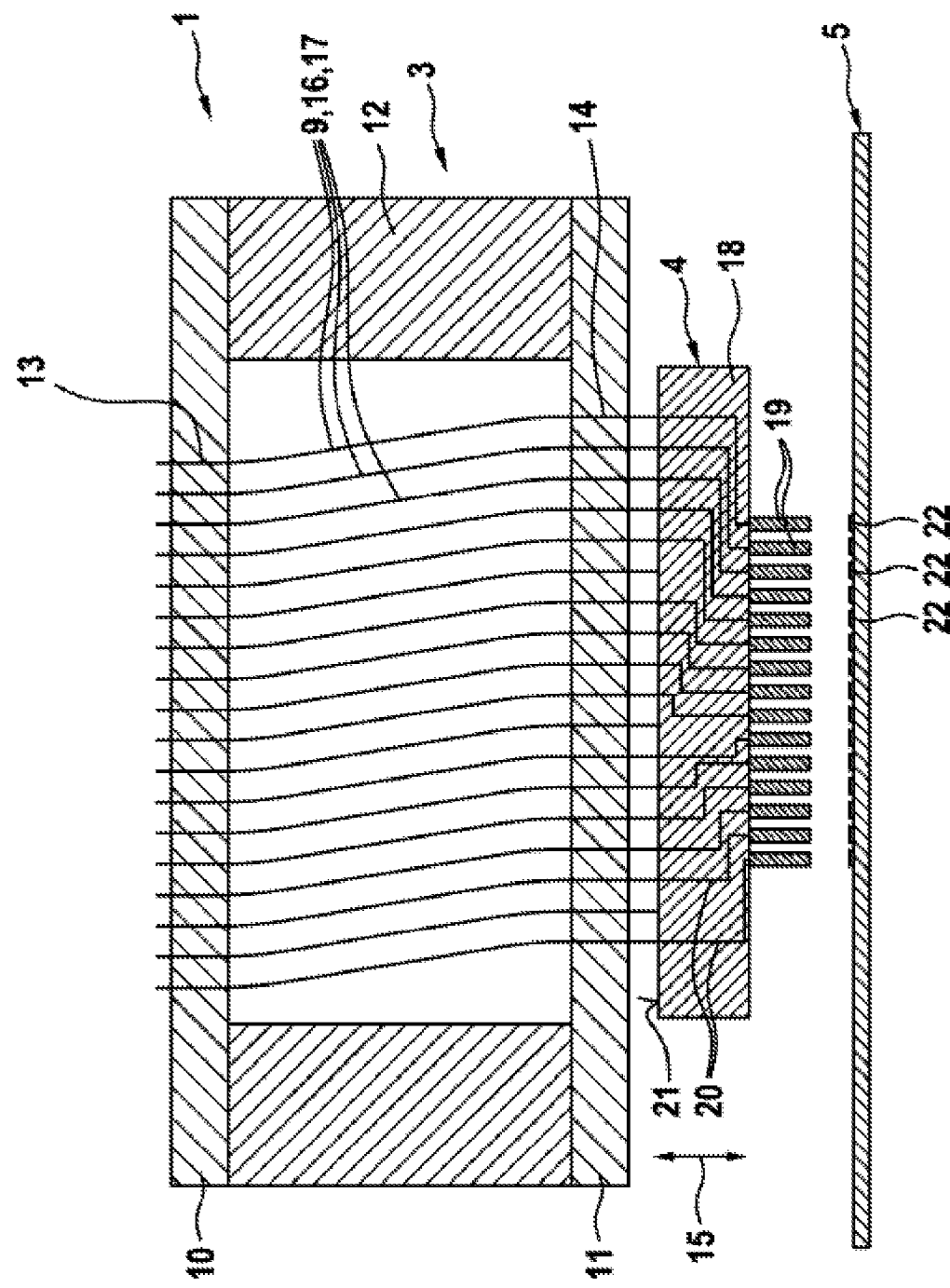

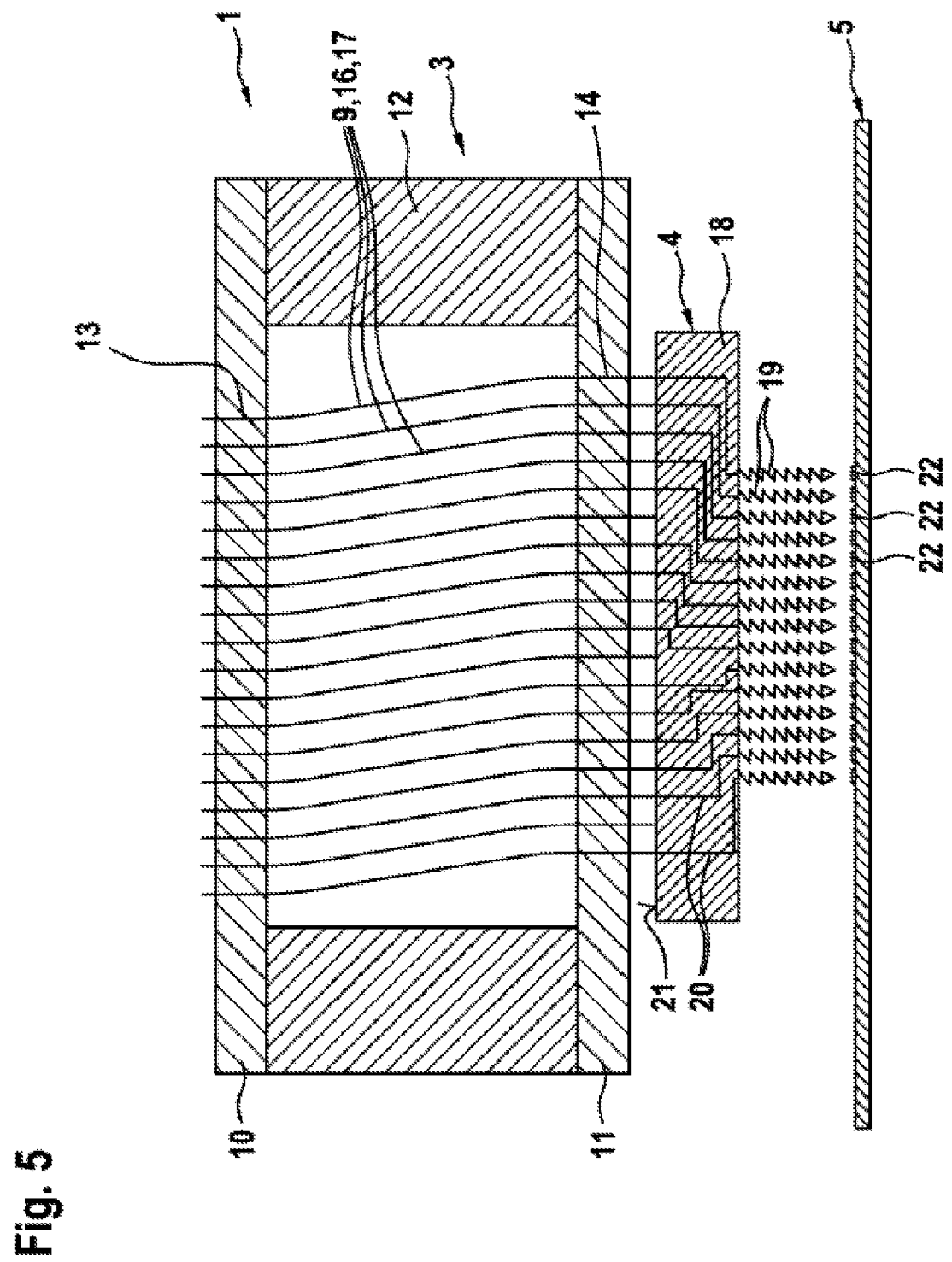

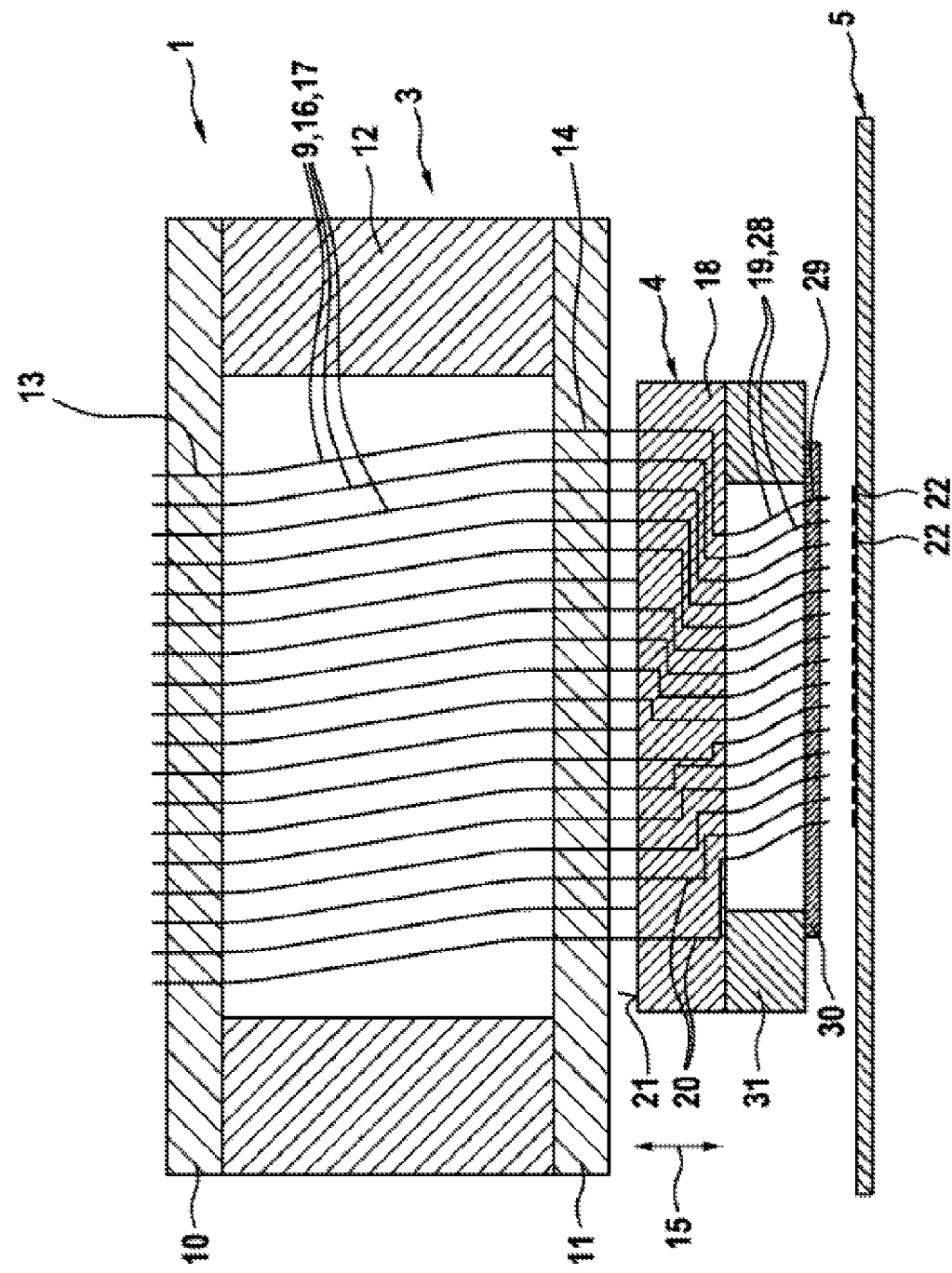

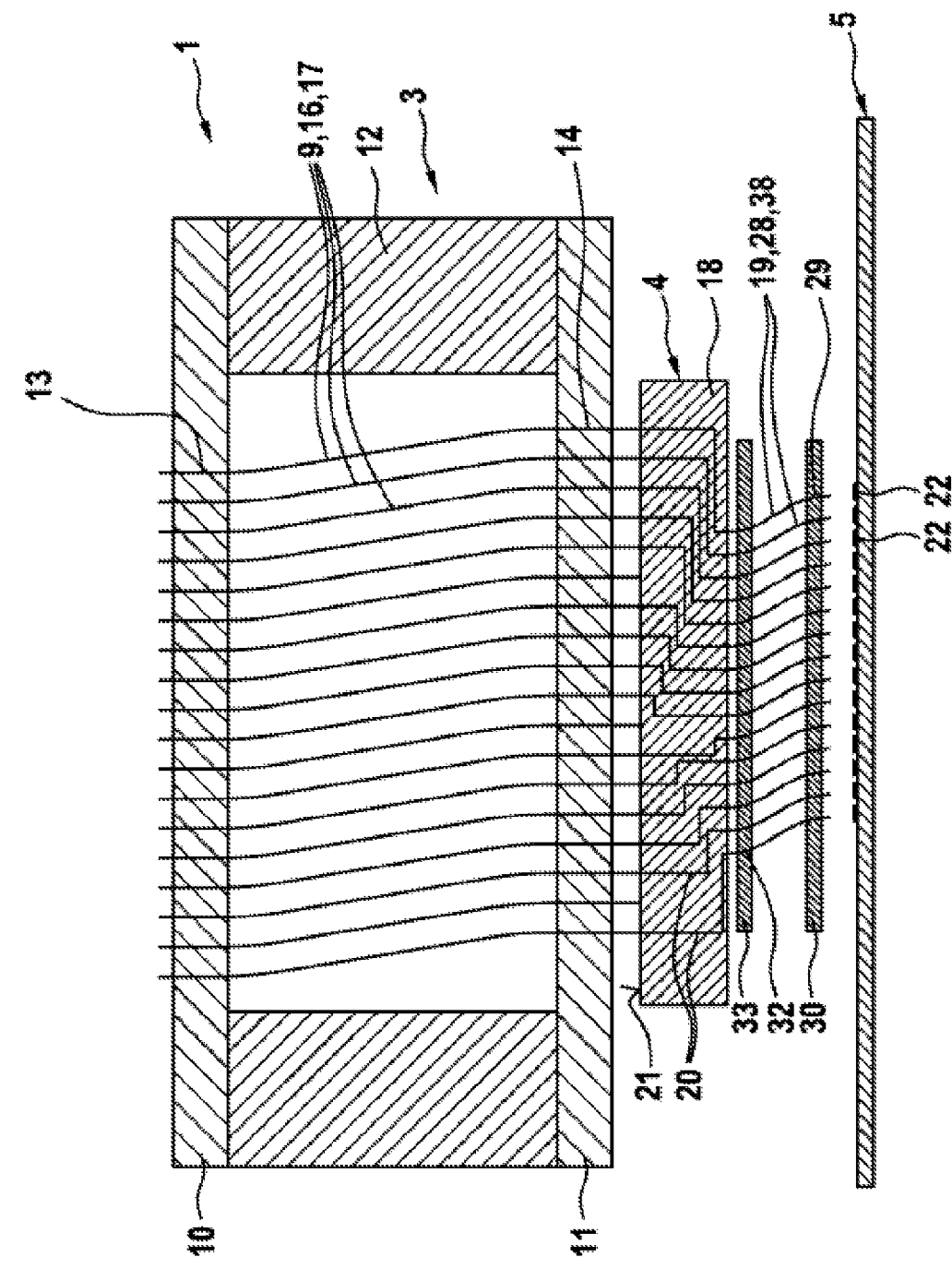

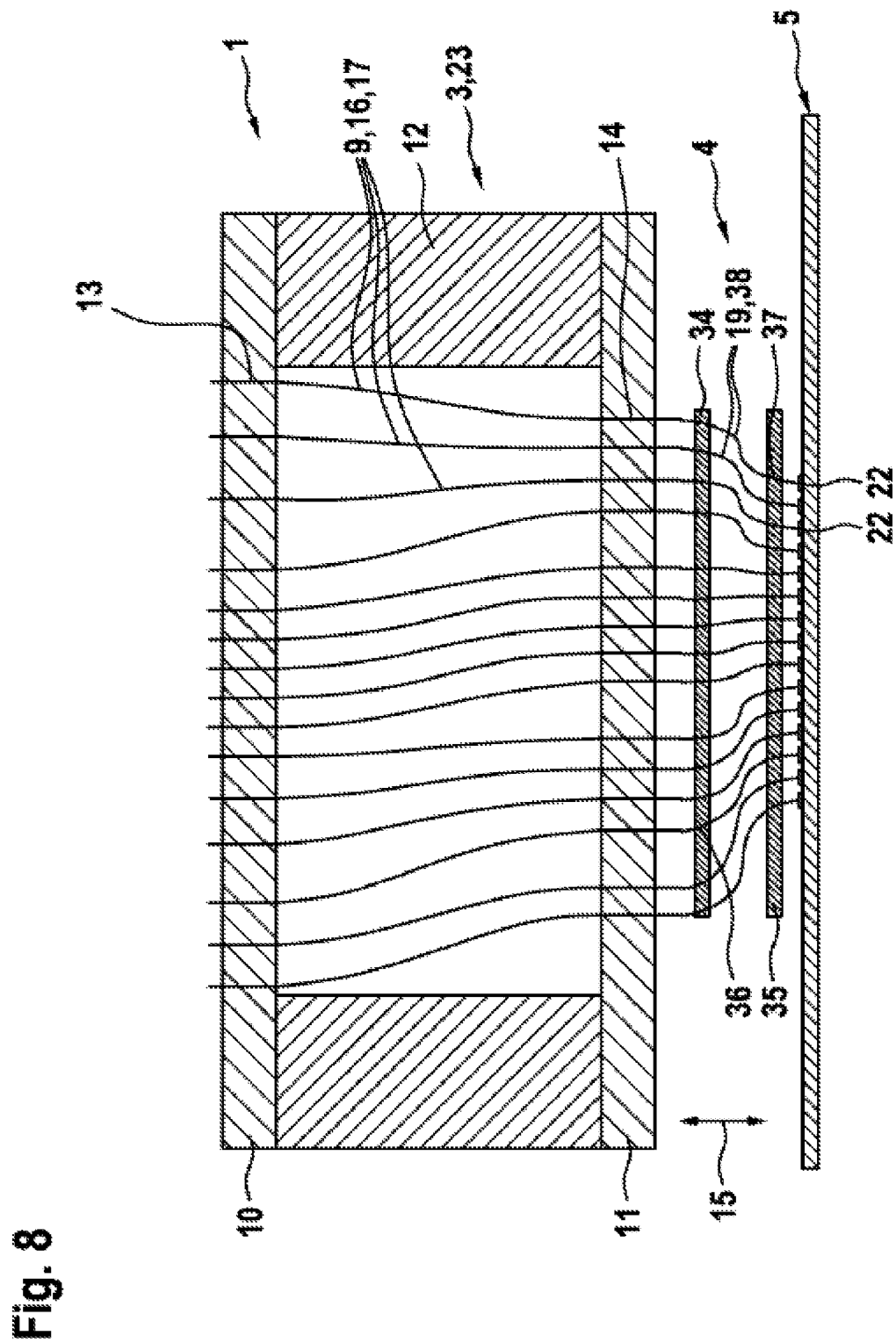

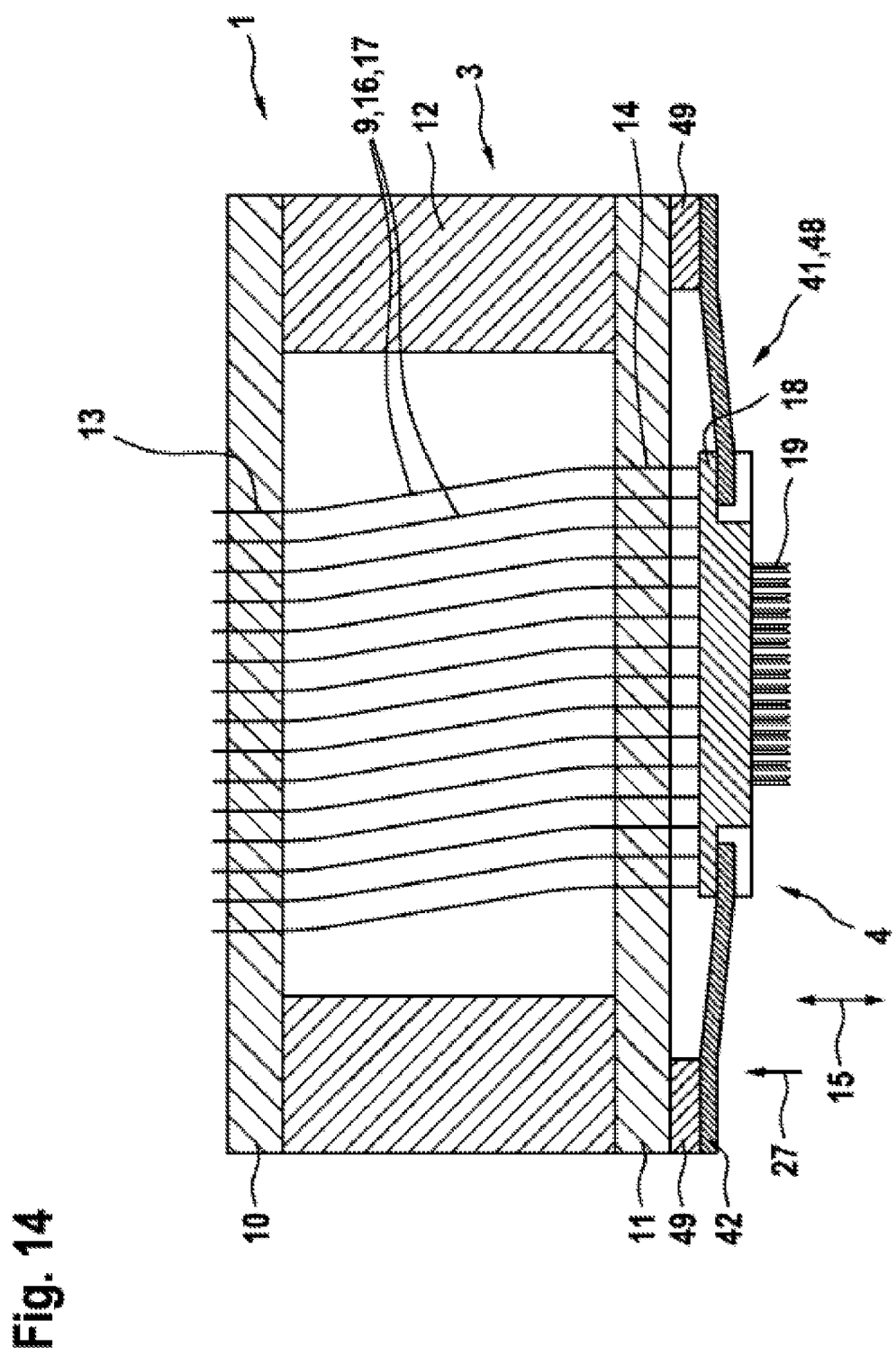

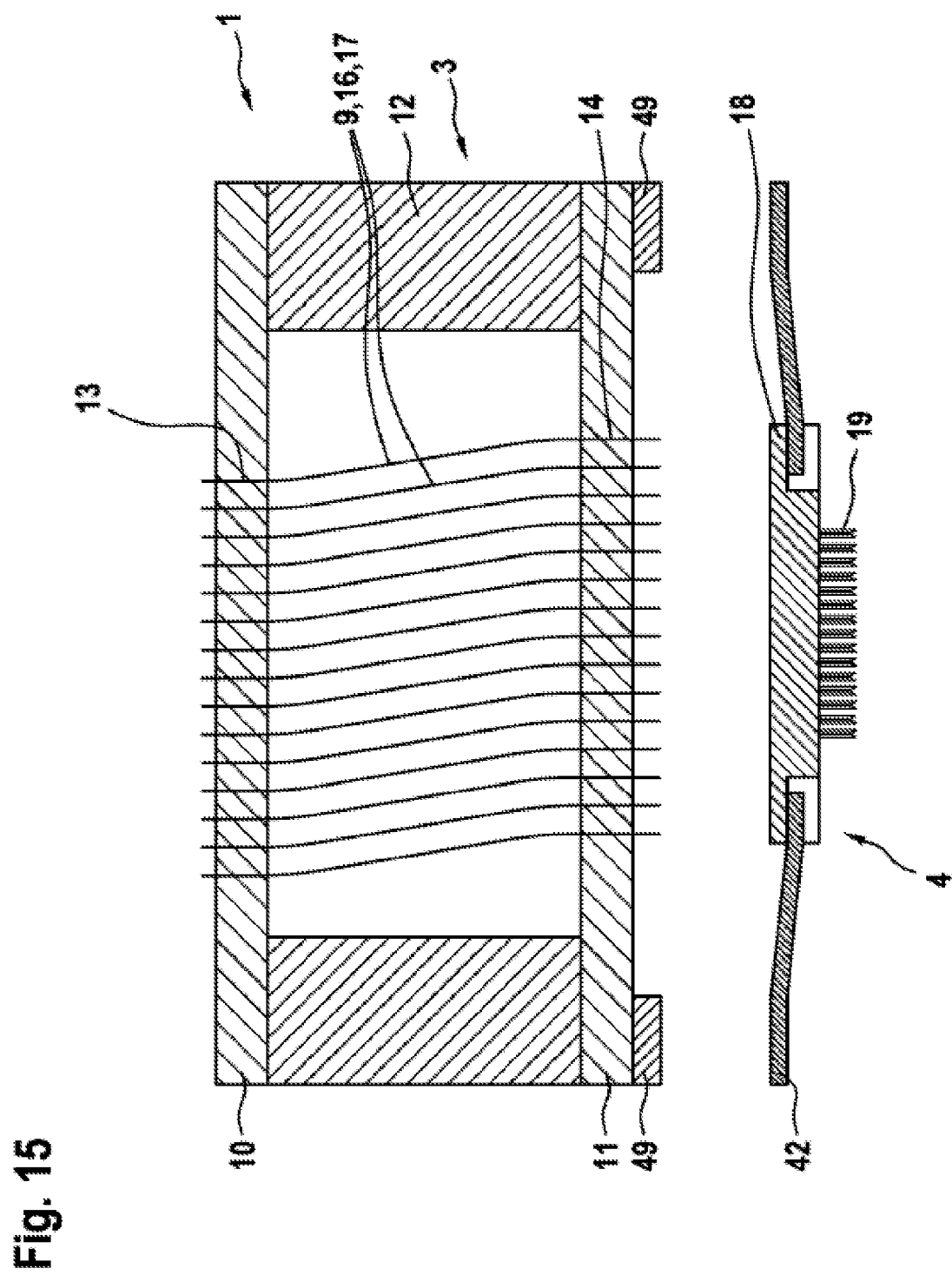

ELECTRICAL CONTACTING DEVICE

CROSS-REFERENCE TO RELATED APPLICATIONS

This application is a 371 U.S. National Stage of International Application No. PCT/EP2014/055890, filed Mar. 25, 2014, which claims the benefit of and priority to German Patent Application No. 10 2013 008324.9, filed May 8, 2013. The disclosures of the above applications are incorporated herein by reference.

The invention relates to an electrical contacting device for electrical physical contact with a specimen, particularly wafers, taking place in a contacting direction, with at least one conductor substrate which can be electrically connected to a testing device, at least one contact distance transformer and at least one contact head having electrical contact elements, particularly resilient contact elements, preferably serving to compensate different physical contact distances existing in the contacting direction particularly at the contact elements.

An electrical contacting device of the type mentioned at the outset is known from U.S. Pat. No. 5,952,843 A. This contacting device has a conductor substrate that cooperates electrically with a contact distance transformer that is electrically connected to a contact head with which an electrical specimen can be tested. For this purpose, contact elements of the contact head are placed in physical contact with corresponding specimen contacts. By means of a testing device that is electrically connected to the conductor substrate, test circuits are activated in order to test the specimen for electrical functionality. The range of application of the known contacting device is limited, particularly given the very narrow contact position of the specimen contacts of the specimen.

It is therefore the object of the invention to provide an electrical contacting device of the type mentioned at the outset that is highly versatile. In particular, the electrical contacting device is to be usable in a trouble-free manner even when the contact position of the specimen contacts is very narrow.

This object is achieved in consideration of the electrical contacting device named at the outset by arranging the contact head between the conductor substrate and the contact distance transformer. In the invention, physical contacting of the specimen occurs by means of the contact distance transformer. Depending on the design of the contact head, particularly depending on the design of its contact elements, the compensation of different physical contact distances (particularly as a result of unevennesses, skew positioning, etc.) of the contact elements requires a commensurate installation space, which is present with the subject matter of the invention, since—when seen from the conductor substrate in the direction of the specimen—the contact paths have a sufficient gap between them, since they are made substantially smaller only in the contact distance transformer adjacent to the contact head in the direction of the specimen. For example, if there is skew positioning between specimen and contacting device, then the compensation of this skew positioning, i.e., of the resulting different-sized physical contact distances, need not occur in an extremely narrow space, but rather in the region of the contact distances or even in the region of the contact distances that are greater than the specimen contact distances, since the contact distance transformer still lies between contact head and specimen, thus serving to reduce the contact distances in the direction of the specimen.

According to a development of the invention, a provision is made that the contact elements are embodied as spring contact elements which are resilient substantially in the contacting direction or have a spring effect substantially in the contacting direction. If the contact elements are contact elements running around particularly in the contacting direction or approximately in the contacting direction, especially preferably so-called vertical wires, then, by virtue of the invention and the resulting relatively large distances of the contact elements, mutual contact thereof, particularly if they are not embodied as insulated vertical wires, need not be feared, so electrical short circuits need not be feared.

By virtue of the invention, a relatively large-scale compensation of existing physical contact distances (in the axial direction, i.e., in the contacting direction) is possible without impairing the spring effect of the contact elements embodied as spring contact elements. As a result, commensurately large spring deflections can be implemented while avoiding the abovementioned danger of short-circuiting. Furthermore, in the subject matter of the invention, the contact elements can also be embodied so as to be sufficiently stable, so that (particularly by means of the contact distance transformer) reliable physical contact occurs, since a commensurately high level of spring force is applied due to the stable design, i.e., the respective physical contact is implemented with a commensurately high level of contact force, thus enabling reliable contact. Furthermore, the relatively stable embodiment of the contact elements of the invention enables a commensurately high current load that does not lead to inadmissible heating and thus also does not lead to measurement errors. In the prior art, if one were to use thick contact elements which then have a commensurately low electrical inherent resistance and also apply sufficient contacting force, then they must necessarily be made to be relatively short, so that the attainable spring deflection is often insufficient. All of these limiting parameters and resulting drawbacks are not present in the subject matter of the invention.

According to a development of the invention, a provision is made that test contacts for the electrical physical contacting of the specimen are displaceably held on the contact distance transformer or that test contacts for the electrical physical contacting of the specimen are attached to the contact distance transformer, the test contacts being respectively embodied as rigid test contacts or as resilient test contacts, particularly test contacts that are rigid in the contacting direction or as test contacts that are resilient in the contacting direction or have a spring effect in the contacting direction. The displaceability of the test contacts enables an improvement in the physical contacting, for example in order to compensate for slight unevennesses. Preferably, displaceably held test contacts can easily be removed from the contact distance transformer in order to exchange them for new test contacts, for example in the event of a defect. The fastened test contacts named above as alternatives do not have the cited displaceabilities. The test contacts can be embodied as rigid test contacts or as resilient test contacts. In the case of rigid test contacts, no compensation of unevennesses, etc., occurs in them. Resilient test contacts are able to compensate for comparatively small unevennesses, etc., during the physical contact.

Overall, it is important for all of the different embodiments of the invention that substantial, i.e., greater physical contact distances be compensated by the contact head, whereas no or only comparatively substantially smaller differences in physical contact distance are compensated by the contact distance transformer. For instance, skew positioning between the specimen and the contacting device is substantially compensated by the contact head. In contrast, only commensurately small unevennesses in physical contact distance are compensated by the contact distance transformer, at best. Depending on the structural design, physical contact distances can exist between the conductor substrate and the contact head, between the contact head and the contact distance transformer and/or between the contact distance transformer and the specimen.

According to a development of the invention, a provision is made that the contact elements are in physical contact with the test contacts or that the contact elements are electrically connected to the test contacts by means of non-detachable connections or that the contact elements and the test contacts are integrally formed with each other. If the abovementioned physical contact is present, then the contacting device has this and another physical contact, namely the physical contact between the contact distance transformer and the specimen. Another physical contact can exist between the contact head and the conductor substrate. The non-detachably interconnected contact elements and test contacts form a unit that is brought about, for example, by gluing, soldering, welding, particularly cold welding. Another noteworthy alternative is that the contact elements be integrally formed with the test contacts, which particularly produces very low-impedance current paths.

Preferably, a provision is made that the contact distance transformer is arranged so as to be resilient in the contacting direction or substantially in the contacting direction by means of a spring bearing or that the contact distance transformer is arranged so as to be displaceable in the contacting direction or substantially in the contacting direction by means of a guide bearing and is resiliently supported by means of the spring contact elements which are resilient substantially in the contacting direction or have a spring effect substantially in the contacting direction. In addition, or alternatively, it is possible to resiliently support the contact distance transformer displaceably arranged by means of the guide bearing by means of a spring device. In both cases, i.e., by means of either the spring bearing or the guide bearing, a displaceability of the contact distance transformer relative to the contact head is made possible in the contacting direction or substantially in the contacting direction. In contrast, the contact head is preferably arranged so as to be stationary. The conductor substrate is preferably also arranged so as to be stationary. In particular, a provision is made that, in order to execute the physical contact, the specimen is moved in the direction of the electrical contacting device until the physical contact occurs. Alternatively, it is also possible for the electrical contacting device to be moved in the direction of the stationary specimen. A third possibility is that the electrical contacting device and specimen both be moved toward each other. In principle, the guide bearing is also a kind of spring bearing that is produced as a result of the fact that the contacting device can be displaced by means of the guide bearing only freely, that is, not against a spring force inherent to the guide bearing, but the spring contact elements have a spring effect in the contacting direction together with the contact distance transformer, whereby the latter also takes on a resilient characteristic along the displacement path of the guide bearing and/or a separate spring device is provided.

According to a development of the invention, a middle centering device is provided for the contact distance transformer. This means that the middle or approximately the middle of the arrangement of the test contacts retains its position to the specimen and/or to the contact head even if temperature fluctuations occur, for example, or a specimen is tested at different temperatures, since the expansion or shrinkage occurring as a result of the influence of temperature act over the surface of those components only starting from the middle as a result of the middle centering device and thus appear only slightly if at all, whereby the electrical contact to the specimen and/or to the contact head is not endangered.

Particularly, a provision can be made that the spring bearing or the guide bearing contributes to forming the middle centering device for the contact distance transformer. In this way, a compact and simple structural form is achieved.

One development of the invention makes a provision that the spring bearing has at least one leaf spring element. This leaf spring element enables the contact distance transformer to be resiliently supported in the contacting direction or substantially in the contacting direction.

In particular, it is advantageous if the spring element has a leaf surface that runs transverse, particularly at a right angle or at a substantially right angle, to the (axial) contacting direction. The spring effect is thus brought about in the contacting direction or approximately in the contacting direction.

According to a development of the invention, a provision is made that the leaf spring element is arranged so as to be displaceably inserted with a first end region into a lateral recess lying on one side of the contact distance transformer and that another, different end region of the leaf spring element is stationary and/or held directly or indirectly on the contact head. The abovementioned indirect holding on the contact head is achieved through interposition of at least one other component. The first end region of the leaf spring element can be resiliently displaced to the other end region, particularly the second end region of the leaf spring element. This occurs transverse, particularly at a right angle, to the leaf surface, particularly in the axial direction, whereby the spring bearing is obtained. If a commensurate deflection of the spring bearing occurs, then the first end region can be radially displaced slightly in the lateral recess. This is necessary for the displacement occurring in the contacting direction.

One development of the invention makes a provision that at least two, preferably three or four, leaf spring elements enclosing an acute angle between them and converging with their first end regions, particularly leaf spring elements embodied on a leaf spring, are provided which are arranged so as to be displaceably inserted in lateral recesses lying on different sides of the contact distance transformer. They are either several individual leaf spring elements, each of which is fixed to its other, particularly second end regions and hold the contact distance transformer with their first end regions, or the leaf spring elements are embodied together on one and the same leaf spring. Through their angularly offset arrangement with respect to one another, they bring about—particularly if there are three or more leaf spring elements—a middle centering of the contact distance transformer, thus forming the spring bearing on the one hand and also the middle centering device on the other hand.

It is advantageous if the leaf spring has a multiple-leafed clover-like, particularly three-leafed clover-like or four-leafed clover-like, opening, with one of the leaf spring elements being embodied between two respective adjacent leaves of the cloverleaf. As a result, the several leaf spring elements are integrally formed together on the leaf spring.

One development of the invention makes a provision that each of the leaf spring elements forms a radial bearing for the radially displaceable supporting of the contact distance transformer with the associated lateral recess. This function was already addressed above.

It is advantageous if the radial direction of each radial bearing runs transverse, particularly perpendicular or substantially perpendicular, to the contacting direction describing the axial direction.

One development of the invention makes a provision that the contact elements of the contact head are embodied and/or arranged such that the contact head forms an additional contact distance transformer. The previously mentioned reduction in contact distance of the first-mentioned contact distance transformer is thus supported by the contact head, which forms the other contact distance transformer, so the sum of both contact distance transformers exert their effect, whereby very narrow specimen contact distances can be physically contacted by means of the electrical contacting device. Preferably, the arrangement is set up such that the substantial reduction in contact distance is achieved by the first-mentioned contact distance transformer, whereas a comparatively smaller reduction in contact distance is achieved by means of the other contact distance transformer, i.e., by means of the contact head.

Furthermore, it is advantageous if the spring constant of at least one of the contact elements is larger or smaller than the spring constant of the associated or respectively associated test contact. A stronger spring effect is thus achieved by the at least one contact element, whereas a less-strongly acting spring effect is achieved by the associated or respectively associated test contact ("larger," particularly FIG. 8) or vice versa ("smaller," particularly FIG. 6).

The arrangement can preferably be set up such that the deflection path of at least one of the test contacts is limited by means of a stop before the entire deflection path of the associated or respectively associated spring contact element has been traveled. During the deflection process, the observed test contact thus deflects as a result of the different-sized spring constants during physical contact, and particularly along a greater spring deflection than the associated contact element. Over the course of further deflection, the test contact strikes the abovementioned stop, with the consequence that it now does not deflect any further or deflects only slightly more and, therefore, only or substantially only the deflection of the contact element now occurs as the physical contacting force increases. Therefore, the spring characteristic curve (spring deflection over force) resulting from the test contact and the contact element has a kink, starting at which the force rises strongly as the spring deflection continues to increase.

The drawings illustrate the invention on the basis of several exemplary embodiments.

FIG. 1 shows a first exemplary embodiment of an electrical contacting device;

FIG. 2 shows the contacting device of FIG. 1 in the contacted state;

FIG. 3 shows detail of the contacting device of FIG. 2;

FIG. 4 shows another exemplary embodiment of an electrical contacting device;

FIG. 5 shows another exemplary embodiment of an electrical contacting device;

FIG. 6 shows another exemplary embodiment of an electrical contacting device;

FIG. 7 shows another exemplary embodiment of an electrical contacting device;

FIG. 8 shows another exemplary embodiment of an electrical contacting device;

FIG. 14 shows a contacting device with the contact distance transformer of FIGS. 12 and 13;

FIG. 15 shows the arrangement of FIG. 14 in the disassembled state.

Figure 9:
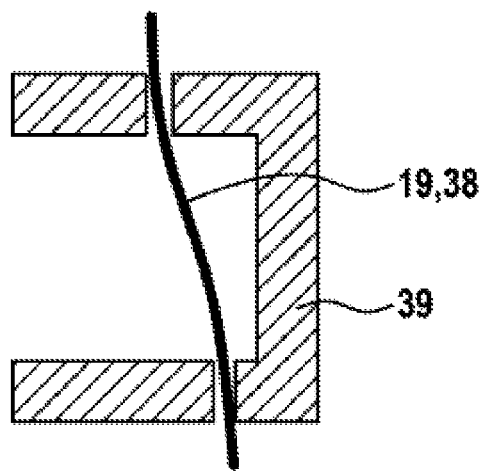
FIGS. 9 to 11 show details of the contacting device of FIG. 8.

FIG. 1 shows a schematic representation of an electrical contacting device 1. The contacting device 1 has a conductor substrate 2, a contact head 3 and a contact distance transformer 4. The contacting device 1 is used to test an electrical specimen 5, particularly a wafer, for electrical functionality. By means of implied electrical connections 6, which lead to a testing device (not shown), the specimen 5 can be physically contacted electrically by means of the contacting device 1 in order to activate test current paths.

The conductor substrate 2 can preferably be embodied as a printed circuit board 7 having conductor paths 8 that are electrically connected to the electrical connections 6 on the one hand and lead to contact fields (pads) on the other hand which cooperate with electrical contact elements 9 of the contact head 3.

The contact head 3 has at least two guide plates 10, 11 that are arranged so as to be spaced apart from one another by means of a spacer 12. The guide plates 10, 11 are provided with guide holes 13, 14 into which the contact elements 9 are displaceably inserted. The contact elements 9 are embodied as spring contact elements 16 that are resilient in the contacting direction 15, particularly as vertical wires 17. This means that the vertical wires 17 between the two guide plates 10 and 11 have at least one bend. The vertical wires 17 attain their resilient characteristic through the bend and through their material characteristic.

The contact distance transformer 4 has a base body 18 to which test contacts 19 are attached so as to point in the direction of the specimen 5. The test contacts 19 are electrically connected to electrical connections 20 that are guided to an upper side 21 of the base body 18 and can cooperate there with the electrical contact elements 9 of the contact head 3. The specimen 5 has specimen contacts 22 which, in this exemplary embodiment, protrude in the manner of columns and can cooperate with the test contacts 19 of the contact distance transformer 4.

It can be seen from FIG. 1 that the electrical connections 20 have a narrower contact distance on the side of the test contacts 19 than on the upper side 21, i.e., the contact distance is reduced in the direction of the specimen 5. An electrical connection 20 need not be associated with every contact element 9, as can be seen from FIG. 1. Furthermore, it should be mentioned that, in the figures of this application, the contacting device 1 and the specimen 5 are depicted only two-dimensionally. This means that contact arrangement of the abovementioned components present in space and particularly in the manner of a matrix can only be seen in two dimensions. Furthermore, many embodiments of this application show a contact head 3 in which the electrical contact elements 9 run substantially parallel to each other, that is, there is no change in contact distance. Only in the exemplary embodiment of FIG. 8 can it be seen that the contact elements 9 have a narrower contact distance in the region of the guide plate 11 than in the region of the guide plate 10. This has the consequence that the contact head 3 forms another contact distance transformer 23. Accordingly, the exemplary embodiments shown in this application can— independently of the specific illustration in the respective figure—either be provided with substantially parallel electrical contact elements or—as indicated in FIG. 8, for example—with "disentangled" contact elements 9 in order to form another contact distance transformer 23—besides the contact distance transformer 4.

FIG. 1 shows the contacting device 1 in the non-contacted state; FIG. 2 shows the contacting device 1 in the contacted state, i.e., the specimen 5 is being physically contacted in order to test it for electrical functionality. For the sake of simplicity, the conductor substrate 2 is not shown in FIG. 2. The same also applies to the following additional exemplary embodiments of the electrical contacting device 1. For the electrical physical contacting of the specimen contacts 22 of the specimen 5, the latter one according to arrow 24 (FIG. 2) is moved in the direction of the contacting device 1, so that the test contacts 19 are placed onto the specimen contacts 22. The specimen 5 is located for this purpose on a lifting table (not shown) that can be displaced in the contacting direction 15. FIG. 3 shows an enlargement of a test contact 19 and of a specimen contact 22. It can be seen that the test contacts 19 are composed of several contact elements 25 that are provided with guide bevels 26. The guide bevels 26 are supported on the specimen contact 22 and bring about commensurate elastic spreading of the contact elements 25, with the consequence that, as a result, a certain spring effect is created—in the contacting direction 15—in order to compensate for contact differences of the specimen contacts 22 and unevennesses of the specimen 5. This axial resilience has only a relatively small effect but helps to achieve clean and low-impedance specimen contact. The test contacts 19 are preferably crown contacts (see FIGS. 1 to 3).

As a result of the feeding of the specimen 5 in the direction of the contacting device 1, not only does the physical contacting of the test contacts 19 with the specimen contacts 22 occur, but a deflection of the contact distance transformer 4 in the direction of the contact head 3 as well. A comparison of FIGS. 1 and 2 shows that, during physical contact, the distance between the contact distance transformer 4 and the contact head 3 becomes smaller, i.e., the contact distance transformer 4 is displaced according to arrow 27 in the contacting direction 15. The contact head 3 is arranged so as to be stationary, that it, it is not displaced. How this displacement is made possible cannot be seen from FIGS. 1 and 2. However, it is explained by FIG. 12. This axial displacement, particularly resilient axial displacement of the contact distance transformer 4 relative to the preferably stationary contact head 5 and to the likewise preferably stationary conductor substrate 2, is also present in all other exemplary embodiments of this application but cannot always be seen in the figures. As a result of the displaceability, which is particularly elastic, namely resiliently elastic, the electrical contact elements 9, particularly the vertical wires 17, are bent elastically or further bent, which can be seen clearly in a comparison of FIGS. 1 and 2. A corresponding contact pressure of the electrical contact elements 9 to the contact fields/conductor paths 8 of the conductor substrate 2 on the one hand and to the exposed front ends of the electrical connections 20 on the other hand thus occurs, thus resulting in low-impedance physical contacts in these two places.

It follows from the figures of this application, particularly from FIG. 1, that the contact head 3 is located between the conductor substrate 2 and the contact distance transformer 4. The contact distance transformer 4 establishes an electrical physical contact with the electrical specimen 5 to be tested, and the conductor substrate 2 can be electrically connected to the testing device (not shown).

In particular, it should be mentioned that the spring deflection occurring in the contacting direction 15 is formed substantially by the contact head 3, i.e., by the electrical contact elements 9, in order to compensate for skew positioning, for example. The test contacts 19 can, for example, due to their guide bevels 26, bring about substantially smaller axial spring deflections, although this slight deflection is only capable of compensating for smaller unevennesses. This principle applies to all exemplary embodiments of the invention, i.e., larger axial spring deflections are performed by the contact head 3, whereas the contact distance transformer 4, particularly the test contacts 19, perform only small spring deflections.

FIG. 4 shows another exemplary embodiment of a contacting device 1 which corresponds substantially to the exemplary embodiment of FIGS. 1 and 2. Reference is therefore made to the corresponding remarks above. All that is different is that, instead of the test contacts 19 having an elastic spring effect in the contacting direction 15, rigid test contacts 19 are present which are rigid in the axial direction, i.e., in the contacting direction 15. During the electrical test, these rigid test contacts 19 come to rest on corresponding specimen contacts 22 of the specimen 5.

FIG. 5 shows another exemplary embodiment of a contacting device 1 which corresponds substantially to the contacting device 1 of FIGS. 1 and 2. Reference is therefore made to the corresponding remarks above. All that is different is that, instead of the test contacts 19 embodied as crown contacts, axially resilient test contacts 19 are provided. These can be embodied as axial springs, vertical wires, cobra contacts, or as bent contact elements (striped beams) provided with at least one slot. In all exemplary embodiments of this application, the test contacts 19 can be firmly arranged on the contact distance transformer 4, or they can be detachably mounted on same.

FIG. 6 shows another exemplary embodiment of a contacting device 1 which corresponds substantially to the contacting device 1 of FIGS. 1 and 2. Reference is therefore made to the corresponding remarks above. All that is different is the embodiment of the contact distance transformer 4. It has—according to FIG. 6—a base body 18 with electrical connections 20, as was also already described in relation to the exemplary embodiment of FIGS. 1 and 2. The test contacts 19 are embodied as resilient or rigid contact needles 28. FIG. 6 shows resilient contact needles 28 that are embodied so as to run in an arch shape and can deflect in the contacting direction 15 upon physical contacting of the specimen 5. The contact needles 28 are displaceably supported in guide bores 29 of a guide plate 30, the guide plate 30 being attached to the base body 18 by means of retaining elements 31. With the conductor substrate 2 (not shown), physical contact occurs by means of the electrical contact elements 9. Furthermore, there is physical contacting of the contact elements 9 with the electrical connections 20. The electrical connections 20 are mechanically and electrically connected to the contact needles 28. This connection is preferably achieved by means of non-detachable connections, particularly soldering, welding, gluing, or the like. Alternatively, a one-piece embodiment of the electrical connections 20 with the contact needles 28 is also conceivable.

The exemplary embodiment of FIG. 7 shows a contacting device 1 which corresponds substantially to the embodiment of FIG. 6 in connection with the embodiments of FIGS. 1 and 2. Reference is therefore made to the corresponding remarks above. All that is different from the embodiment of FIG. 6 is that the resilient (because arch-shaped) contact needles 28 are displaceably guided in guide bores 29 of a guide plates 30 not only in the direction of the specimen 5, but are also supported displaceably in guide bores 32 of another guide plate 33 that is adjacent to the base body 18.

Figure 10:
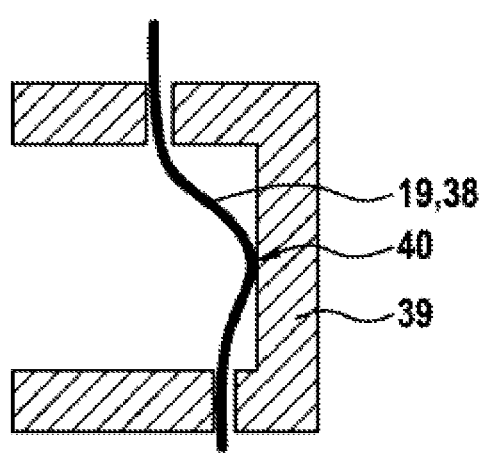
Figure 11:
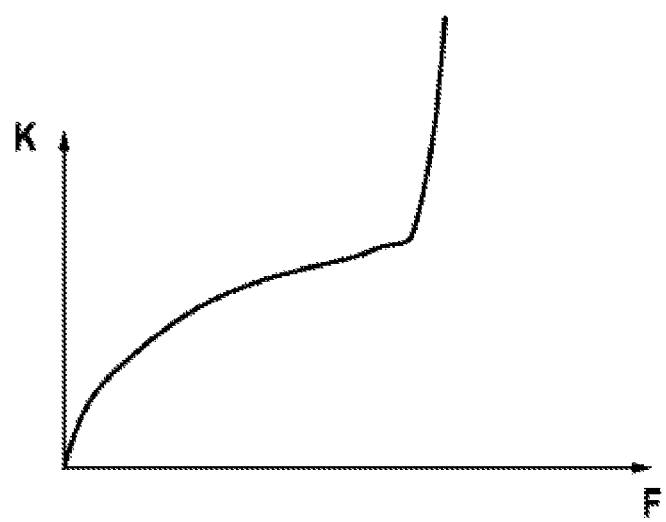

FIG. 8 shows an exemplary embodiment of a contacting device 1 which corresponds substantially to the exemplary embodiment of FIGS. 1 and 2. Reference is therefore made to the corresponding remarks above. However, the embodiment of the contact distance transformer 4 is different. In the exemplary embodiment of FIG. 8, it is embodied similarly to the contact head 3 in that it has two mutually spaced-apart guide plates 34 and 35 having guide bores 36, 37 that are interspersed with test contacts 19 embodied as vertical wires 38. Preferably, the vertical wires 38 are displaceably supported both in the guide bores 36 and in the guide bores 37. On sides of the contact head 3, their electrical contact elements 9 are mechanically and electrically connected to the vertical wires 38, preferably in a non-detachable manner, preferably by means of soldering, welding, gluing, or the like. Due to the embodiment of the test contacts 19 as vertical wires 38 having at least one arch between the guide plates 34 and 35, resilient test contacts 19, namely test contacts 19 that are resilient in the contacting direction 15, are produced. FIGS. 9 and 10 make clear that the vertical wires 38 each cooperate with a stop 39. This can be a stop wall. If a deflection of a vertical wire 38 occurs, then it continues to bend according to FIGS. 9 and 10, the increasing bend coming to rest against the stop 39 (arrow 40). The deflection path is thus limited. The arrangement is preferably set up such that the spring constant of the contact elements 9, particularly of the vertical wires 17, is greater than the spring constant of the vertical wires 38. This has the consequence that a characteristic according to the diagram of FIG. 11 is created. There, the force K (spring force) is applied via the spring deflection F. It can be seen that, initially during deflection, it is substantially the spring constant of the vertical wire 38 that acts until the vertical wire 38 strikes the stop 39. From there, the characteristic curve rises steeply at a kink, since the spring constant of the vertical wire 17 now dominates.

Figure 12:
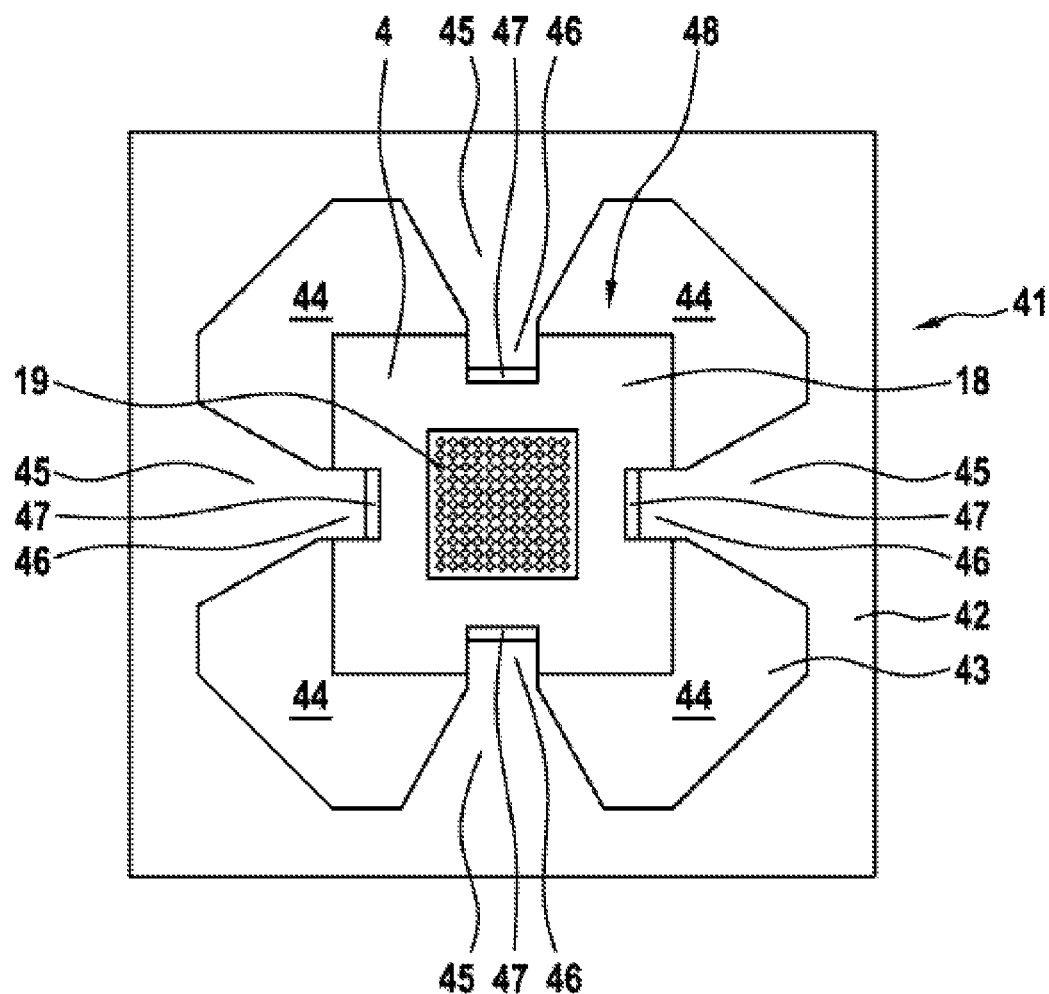
FIG. 12 shows a contact distance transformer of one of the aforementioned contacting devices.
Figure 13:
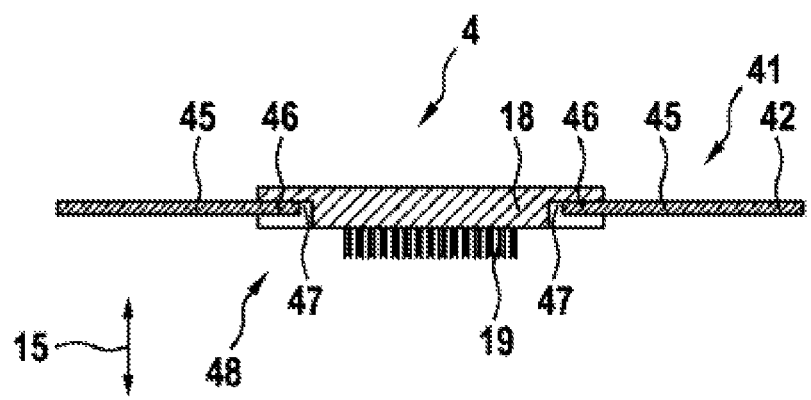
FIG. 13 shows a lateral sectional view of the arrangement of FIG. 12.

As already mentioned, a provision is made in all exemplary embodiments of the invention that the contact distance transformer 4 is arranged so as to be resilient in the contacting direction 15 or substantially in the contacting direction 15. A spring bearing 41 is provided for this purpose. An exemplary embodiment of the spring bearing 41 can be seen in FIG. 12. The spring bearing 41 has a leaf spring 42 which has a multiple-leafed clover-like opening 43. In the exemplary embodiment of FIG. 12, it is a four-leafed clover-like opening 43. A leaf spring element 45 is respectively embodied in the manner of a tongue between two respective adjacent leaves 44 of the opening 43. The leaf spring elements 45 have end regions 46 which converge on each other and are arranged so as to be displaceably inserted in lateral recesses 47 of the base body 18. This embodiment can also be seen in FIG. 13. By virtue of the described arrangement that is illustrated in FIG. 12, and through the displaceably insertion of the end regions 46 of the leaf spring elements 45 into the lateral recesses 47, not only is a resilient supporting of the contact distance transformer 4 in the contacting direction 15, i.e., in the axial direction, but rather, at the same time, a middle centering device 48 for the contact distance transformer 4 is also formed.

According to FIG. 14, the leaf spring 42 can be attached to the outer edge of the contact head 3 by means of retaining elements 49. Furthermore, it is additionally or alternatively conceivable, but not necessary, that the leaf spring elements 45 be somewhat biased in the direction of the specimen (see FIG. 14) in order to exert, already in the state in which the specimen 5 is not contacted, a physical contact force of the contacts of the contact distance transformer 4 onto the contacts of the contact head 3. It is also conceivable for the leaf spring elements 45 to all lie on a plane in the non-deflected state.

With reference to FIG. 14, if a physical contacting of the specimen 5 (not shown there in FIG. 14) now occurs, the contact distance transformer 4 is resiliently displaced in the direction of the contact head 3 in the contacting direction 15 and, upon completion of the physical contact, the contact distance transformer 4 rebounds back into its initial position.

According to FIG. 15, the arrangement can be set up such that an easy exchange of the leaf spring 42 can be performed particularly by detaching the leaf spring 42 from the retaining elements 49 and pulling out the leaf spring elements 45 inserted only with their end regions 46 into the lateral recesses 47. This can be done, for example, through strong axial pressure. A new leaf spring 42 can be mounted in an analogous manner.

Based on the invention, a quasi-main contact head is present, namely the contact head 3. Furthermore, another plane is used on which a reduction in contact distance in the direction of the specimen 5 to be tested occurs. It is important in this regard that this plane be adjacent to the specimen 5, i.e., that the contact head 3 is arranged between the conductor substrate 2 and the contact distance transformer 4. Alternatively or in addition, it is important that the contact distance transformer 4 execute a stroke during contacting, i.e., that it is arranged so as to be displaceable, particularly resiliently displaceably, in the contacting direction 15.

The test contacts 19 can be embodied in different ways, for example as bellows-like contact needles, particularly of metal or of non-conductive or weakly conductive material with a metallic or very highly conductive surface. Furthermore, buckling-beam-like contact needles can be used which exploit the principles of Euler's buckling case. Furthermore, cobra-like vertical (axial) contact needles can be used which exploit an inherent bend. Furthermore, horizontally resilient (radially resilient) contact needles according to the cantilever principle can be used, the resilient being composed of one or optionally several elements arranged parallel to each other and perpendicular to the desired spring direction. Furthermore, contact elements according to the striped bean principle with several, predominantly vertically (axially) aligned fins can be used, the cross section being such that the direction of deflection is predetermined. Furthermore, crown-like contact needles can be used which are slotted in the direction of the specimen or embodied as several parts and perform a slight spring deflection through spreading. A printed circuit board, particularly organic printed circuit board or ceramic printed circuit board, can be used in the contact distance transformer 4 (space transformer). Furthermore, it is possible to use a wafer with through-contacts.

According to FIG. 14, the contact distance transformer 4 is embodied such that, during each contact stroke, a relative axial movement occurs to the main contact head, i.e., to the contact head 3. Here, the arrangement can also be set up such that, through resilient supporting of the contact distance transformer 4, force is not exerted by the contact distance transformer 4 on the contact head 3, not even in the state in which the specimen 5 is being contacted, whereby a contact pressure is applied to the electrical contact elements 9 of the contact head 3.

The abovementioned middle centering of the contact distance transformer 4 can be achieved in a different manner, for example by pins that run in the contacting direction 15 and engage in slotted holes of the contact distance transformer 4. The slotted holes are aligned in their longitudinal direction toward the middle, i.e., toward the center, of the contact distance transformer 4.

The S-shaped electrical connections 20 shown in the figures can be used for the contact distance transformer 4 in order to influence the contact distance. As will readily be understood, other embodiments are also conceivable, for example with tilted contacts. The same applies to the contact elements 9 of the contact head 3.

In or on the resiliently mounted contact distance transformer 4, passive (capacitors, resistors, coils) or active (transistors, microelectronics) components can be present which are provided either integrally, i.e., as integral components of the contact distance transformer 4, or mounted on same. Through the design of the resilience of the contact distance transformer 4, e.g., by means of the depicted leaf spring 42, or also by other measures which are easily implemented by an average person skilled in the art if he is familiar with the fundamental principle of resilient mounting, a bias can be implemented in the direction of the contact head 3. The force-path characteristic curve of the contact distance transformer 4 against the electrical contact elements 9 of the contact head 3 can be set through appropriate implementation of this spring in terms of shape and inclination. This makes leveling easy. As shown in the figures, the contact elements 9 of the contact head 3 can be composed of axially running spring elements, although other possibilities are also conceivable, particularly a cantilever design, particularly using wire made of wolfram alloys, for example, a microcantilever design (using LIGA technology and made of nickel alloys, for example), as a membrane that is impinged with pressurized air or spring-loaded with a polymer pillow comprising predominantly axially, particularly vertically aligned bending elements embodied in plates as visible in the figures, or freestanding, made of wire or using LIGA technology, optionally according to the striped beam principle, i.e., as laminated contact elements. The connection points between the spring elements (contact elements) of the contact head 3 and those in the resiliently mounted contact distance transformer 4 can be a purely physical contact. In that case, the resiliently mounted contact distance transformer 4 can easily be exchanged. However, it can also be a non-detachable connection instead of the physical contact. It is also possible for both of these spring elements to be composed of one component.

The invention claimed is:

1. An electrical contacting device for electrical physical contact with a specimen, taking place in a contacting direction, the electrical contacting device comprising:
   at least one conductor substrate to be electrically connected to the electrical contacting device;
   at least one contact distance transformer; and
   at least one contact head having electrical contact elements, the contact head arranged between the conductor substrate and the contact distance transformer, and with a middle centering device of the contact distance transformer;
   wherein the middle centering device includes at least two leaf spring elements, each leaf spring including a first end region, a respective end regions arranged so as to be displaceably inserted in an associated lateral recess lying on different sides of the contact distance transformer,
   wherein the contact distance transformer is arranged resiliently in a contacting direction by a spring bearing, whereby the spring bearing contributes to forming the middle centering device for the contact distance transformer, and
   wherein each of the leaf spring elements forms with the associated lateral recess a radial bearing for radially displaceably supporting the contact distance transformer, a radial direction of each radial bearing running transverse to the contracting direction.

2. The electrical contacting device as set forth in claim 1, wherein the at least two leaf spring elements includes three leaf spring elements.

3. The electrical contacting device as set forth in claim 1, wherein the at least two leaf spring elements includes four leaf spring elements.

4. The electrical contacting device as set forth in claim 1, wherein the contact elements are spring contact elements resilient substantially in a contacting direction or have resilient spring action substantially in the contacting direction.

5. The electrical contacting device as set forth in claim 1, wherein test contacts for the electrical physical contacting of the specimen are displaceably held on the contact distance transformer or that test contacts for the electrical physical contacting of the specimen are attached to the contact distance transformer, each of the test contacts being embodied as rigid test contacts or as resilient test contacts, particularly as test contacts that are rigid in the contacting direction or as test contacts that are resilient in the contacting direction or have a spring effect in the contacting direction.

6. The electrical contacting device as set forth in claim 5, wherein the contact elements are in physical contact with the test contacts or that the contact elements are electrically connected to the test contacts by non-detachable connections or that the contact elements and the test contacts are integrally formed with each other.

7. The electrical contacting device as set forth in claim 1, wherein the respective leaf spring element has a leaf surface that runs transverse, particularly at a right angle or at a substantially right angle, to the contacting direction.

8. The electrical contacting device as set forth in claim 1, wherein the respective leaf spring element is arranged so as to be displaceably inserted with a first end region into the lateral recess lying on one side of the contact distance transformer and that an additional, other end region of the leaf spring element is stationary and/or held directly or indirectly on the contact head.

9. The electrical contacting device as set forth in claim 1, wherein the leaf spring elements are on a leaf spring.

10. The electrical contacting device as set forth in claim 9, wherein the respective leaf spring has an opening in a shape of a cloverleaf selected from a group consisting of a three-leafed clover-like opening and a four-leafed clover-like; opening, with one of the leaf spring elements being embodied between two respective adjacent leaves of the cloverleaf.

11. The electrical contacting device as set forth in claim 1, wherein the radial direction of each radial bearing runs transverse to the contacting direction describing an axial direction.

12. The electrical contacting device as set forth in claim 1, wherein the radial direction of each radial bearing runs perpendicular to the contacting direction describing an axial direction.

13. The electrical contacting device as set forth in claim 1, wherein the contact elements of the contact head are embodied and/or arranged such that the contact head forms another contact distance transformer.

14. The electrical contacting device as set forth in claim 1, wherein a spring constant of at least one of the contact elements is larger or smaller than the spring constant of the associated or respectively associated test contact.

15. The electrical contacting device as set forth in claim 5, wherein a deflection path of at least one of the test contacts is limited by means of a stop before an entire deflection path of the associated or respectively associated contact element has been traveled.

16. The electrical contacting device as set forth in claim 1, wherein a base body of the contact distance transformer is disposed in a center of an opening in the middle-centering device and a plurality of leaf-like portions of the opening extend beyond a periphery of the base body, the first leaf spring element located between a first adjacent pair of leaf-like portions of the opening and the second leaf spring element located between a second adjacent pair of leaf-like portions of the opening.

17. The electrical contacting device as set forth in claim 1, further comprising third and fourth leaf spring elements,
   wherein the first leaf spring is located between a first and a second leaf-like portion of the opening, the second leaf spring is located between the second and a third leaf-like portion of the opening, the third leaf spring is located between the third and a fourth leaf-like portion of the opening, and a fourth leaf spring is located between the fourth and the first leaf spring openings.

18. An electrical contacting device for electrical physical contact with a specimen, taking place in a contacting direction, the electrical contacting device comprising:

a conductor substrate;

a contact head having electrical contact elements; and a contact distance transformer resilient in the contact direction, the contact distance transformer including a leaf spring defining an opening, the contact distance transformer having at least first and second leaf spring elements, each leaf spring including a first end region displaceably inserted in an associated lateral recess lying on different sides of the contact distance transformer, wherein each of the leaf spring elements cooperates with the associated lateral recess to form a radial bearing for radially displaceably supporting the contact distance transformer, a radial direction of each radial bearing being transverse to the contacting direction.

19. The electrical contacting device as set forth in claim 18, further comprising third and fourth leaf spring elements.

20. The electrical contacting device as set forth in claim 18, wherein a base body of the contact distance transformer is disposed in a center of the opening and a plurality of leaf-like portions of the opening extend beyond a periphery of the base body, the first leaf spring element located between a first adjacent pair of leaf-like portions of the opening and the second leaf spring element located between a second adjacent pair of leaf-like portions of the opening.

21. The electrical contacting device as set forth in claim 20, further comprising third and fourth leaf spring elements,
   wherein the first leaf spring is located between a first and a second leaf-like portion of the opening, the second leaf spring is located between the second and a third leaf-like portion of the opening, the third leaf spring is located between the third and a fourth leaf-like portion of the opening, and a fourth leaf spring is located between the fourth and the first leaf spring openings.

\* \* \* \* \*